(12) United States Patent
Hashimoto et al.

(10) Patent No.: US 7,078,622 B2
(45) Date of Patent: Jul. 18, 2006

(54) IC SOCKET ASSEMBLY

(75) Inventors: Shinichi Hashimoto, Kanagawa (JP); Hiroshi Shirai, Saitama (JP)

(73) Assignee: Tyco Electroncics AMP K.K., Kanagawa-Ken (JP)

( * ) Notice: Subject to any disclaimer, the term of this patent is extended or adjusted under 35 U.S.C. 154(b) by 78 days.

(21) Appl. No.: 10/955,440

(22) Filed: Sep. 30, 2004

(65) Prior Publication Data

US 2005/0068752 A1 Mar. 31, 2005

(30) Foreign Application Priority Data

Sep. 30, 2003 (JP) ....................... 2003-340025

(51) Int. Cl.
*H01R 13/46* (2006.01)

(52) U.S. Cl. .................. 174/60; 174/50; 174/52.1; 174/50.54; 174/52.4; 174/17 R; 439/259; 439/342; 439/260; 361/704; 361/707

(58) Field of Classification Search ............ 174/60, 174/50, 52.1, 50.54, 52.4, 17 R; 439/259, 439/342, 260; 361/704, 707
See application file for complete search history.

(56) References Cited

U.S. PATENT DOCUMENTS 5,057,031 A * 10/1991 Sinclair ............... 439/261
6,431,899 B1 * 8/2002 Keller .................. 439/342
6,554,624 B1 * 4/2003 Yu ...................... 439/135

FOREIGN PATENT DOCUMENTS

JP 2002-313509 10/2002

* cited by examiner

*Primary Examiner*—Dean A. Reichard
*Assistant Examiner*—Anton Harris
(74) *Attorney, Agent, or Firm*—Barley Snyder

(57) ABSTRACT

Deformation of a socket housing during connection of an IC package is prevented, and reliable electrical connections are secured in an IC socket assembly. The IC socket assembly is constituted by a plurality of electrical contacts; an insulative socket housing for holding the electrical contacts arranged in a matrix; a reinforcing plate having an opening at its center, through which the electrical contacts are exposed, for supporting the lower portion of the socket housing; a cover member, which is rotatably supported by the reinforcing plate, for cooperating with the reinforcing plate to sandwich and hold the IC package therebetween and to press the IC package against the electrical contacts; and reinforcing beams, which are supported by the reinforcing plate and provided across opposing edges of the opening, for supporting the socket housing.

6 Claims, 4 Drawing Sheets

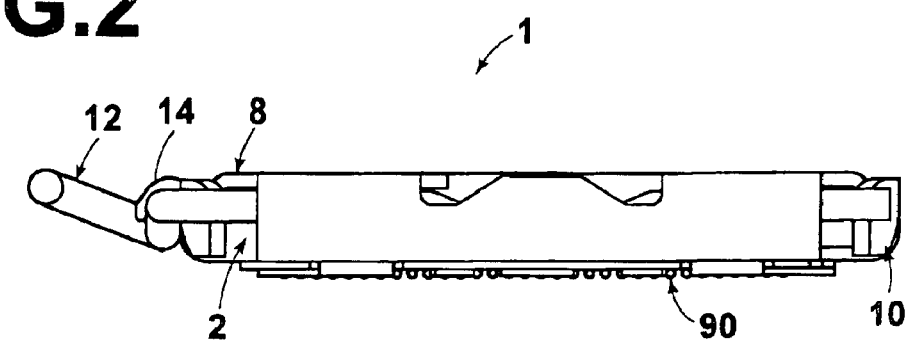
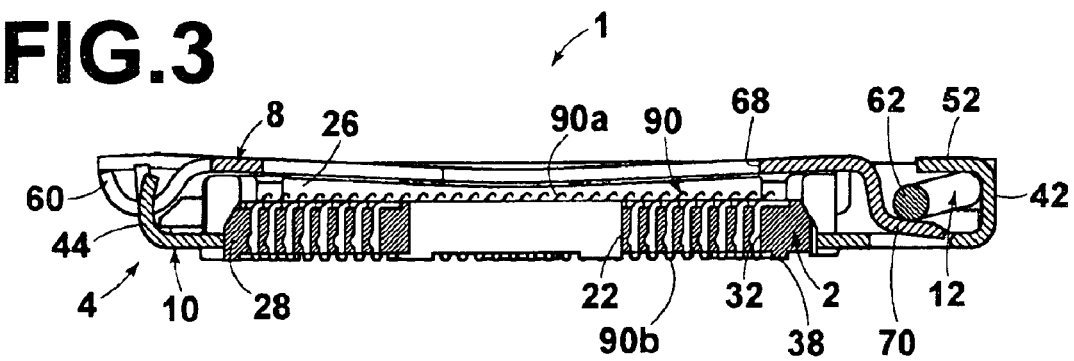

IC SOCKET ASSEMBLY

FIELD OF THE INVENTION

The present invention relates to an IC socket assembly and more particularly to an IC socket assembly wherein a socket housing and an IC package placed atop the socket housing are sandwiched between a reinforcing plate provided below the socket housing and a cover member for pressing the IC package against the socket housing.

BACKGROUND

A conventional IC socket assembly for a PGA (Pin Grid Array) package is disclosed in Japanese Unexamined Patent Publication No. 2002-313509 (FIG. 1, FIG. 11). This IC socket assembly comprises a base housing, which is constructed by molding plastic material over a metallic reinforcing plate having a square frame shape. In this PGA socket, a terminal mounting portion is positioned at the approximate center of the base housing. The metallic reinforcing plate reinforces the periphery of the terminal mounting portion. A cam driven sliding plate is provided on the base housing. An IC package is placed on the sliding plate. Lead pins of the IC package, engage with terminals, which are provided in the terminal mounting portion, by a horizontal sliding motion of the sliding plate, thereby establishing electrical connections between the lead pins and terminals.

In the conventional IC socket assembly described above, the terminals apply a force to the base housing during engagement of the lead pins and the terminals. This force works to deform the base housing. The base housing is reinforced by the square frame shaped metallic reinforcing plate to counter this force. However, the base housing is reinforced only at the periphery thereof. An opening is formed at the terminal mounting portion, where the terminals are provided. Thus the terminal mounting portion, to which force is applied by the terminals, is not reinforced. Accordingly, there is a possibility that deformation of the base housing will occur at the terminal mounting portion.

In another known IC socket assembly, a cover member presses, from above, on an IC package placed atop a socket housing to connect lead pins of the IC package to electrical contacts of the socket housing. In this IC Socket, the force from above is applied to the socket housing via the electrical contacts, and there is a possibility that the housing may be deformed and bend. Generally, IC sockets are mounted on printed circuit boards by soldering. However, excessive force is applied in a direction that acts to separate the socket housing from the circuit board at solder connections, particularly of the electrical contacts positioned at the peripheral portions, due to warping or bowing of the socket housing. In addition, the electrical contacts at the central portion separate from the IC package, and contact pressures as set by design cannot be obtained. Accordingly, it is difficult to realize highly reliable electrical connections in a state in which this force is applied.

However, the electrical contacts mounted in this type of IC socket assembly are arranged in a matrix. Therefore, it is difficult to prevent deformation of the socket housing by reinforcing the socket housing at a terminal mounting portion.

SUMMARY

According to an exemplary embodiment of the present invention, an IC socket assembly is providing that comprises:

a plurality of electrical contacts;

an insulative socket housing for holding the electrical contacts arranged in a matrix;

a frame-shaped reinforcing plate for supporting the lower portion of the socket housing, having an opening at its central portion through which the electrical contacts are exposed; and a cover member, which is pivotally supported by the reinforcing plate, for sandwiching an IC package between the cover and the socket housing and for pressing the IC package against the electrical contacts; wherein reinforcing beams for supporting the socket housing are provided across opposing edges of the opening, supported by the reinforcing plate. A plurality of reinforcing beams may be provided.

BRIEF DESCRIPTION OF THE DRAWINGS

FIG. 2 is a front view of the IC socket assembly of FIG. 1.

FIG. 3 is a vertical sectional view of the IC socket assembly of FIG. 1, taken along line III—III of FIG. 1.

DESCRIPTION OF THE PREFERRED EMBODIMENTS

Hereinafter, an IC socket assembly (hereinafter, simply referred to as "assembly") according to a preferred embodiment of the present invention will be described in detail with reference to the attached drawings.

Figure 1:
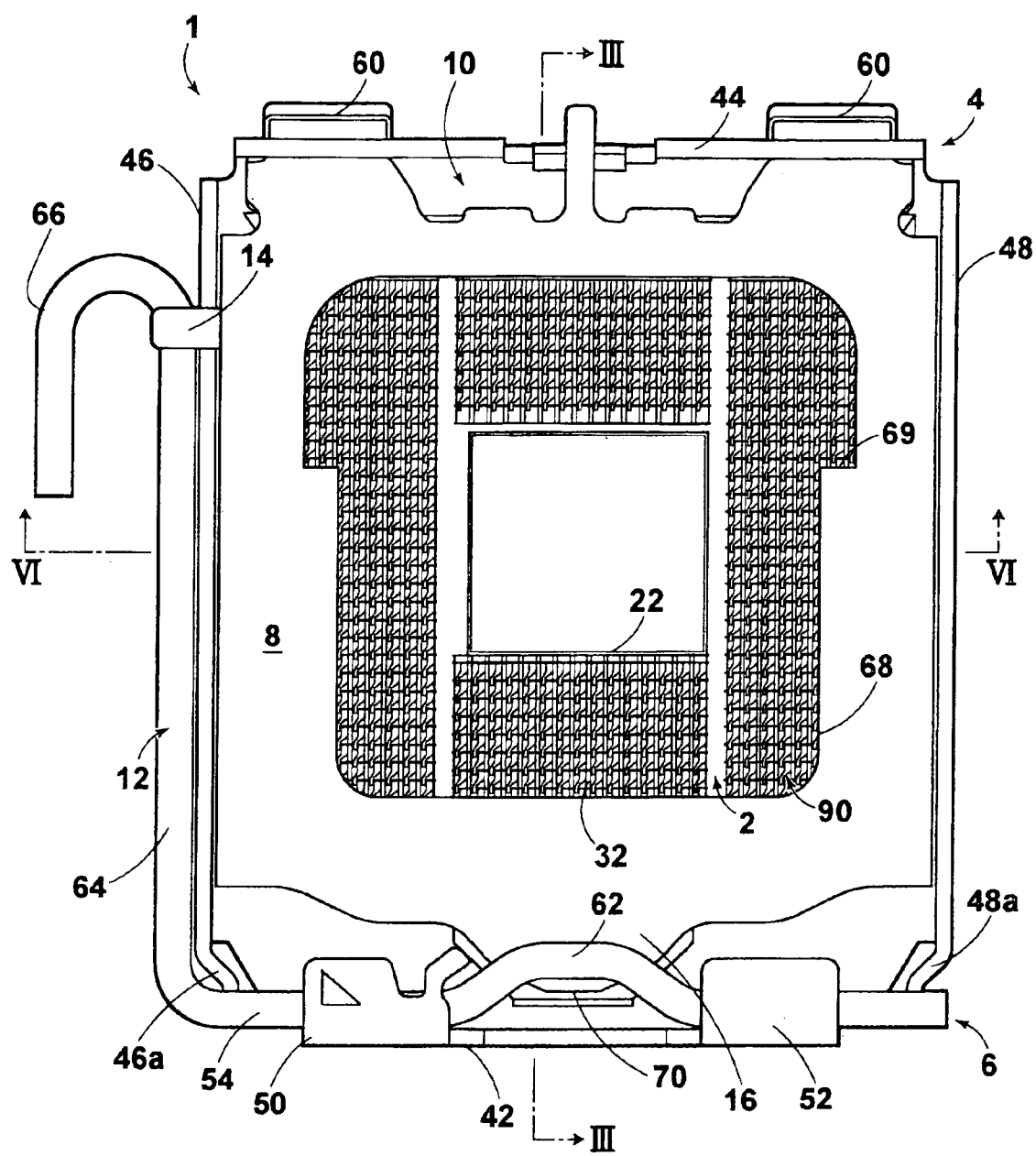
FIG. 1 is a plan view of an IC socket assembly according to an exemplary embodiment of the present invention.

First, the schematic construction of the assembly 1 will be described with reference to FIG. 1. The assembly 1 comprises an insulative socket housing 2 (hereinafter, simply referred to as "housing"); a cover member 8; a metallic reinforcing plate 10 (hereinafter simply referred to as "reinforcing plate"); and a lever 12. In a exemplary embodiment, the housing 2 is molded from resin. The cover member 8 is pivotally mounted to the housing 2 at a first end 4 thereof, and has a substantially rectangular opening 68. The reinforcing plate 10 is mounted on the bottom surface of the housing 2 (refer to FIG. 4). The lever 12 is axially supported at a second end 6 of the housing 2, and has a function of locking (engaging) the cover member 8. A great number of contacts 90 are provided in the housing 2. Note that an IC package 200, which is to be placed on the housing 2, is indicated by broken lines in FIG. 5.

Next, the housing 2 will be described in detail. The housing 2 is formed as a rectangular plate having a rectangular opening 22 at its center. An upwardly extending peripheral wall 24 (refer to FIG. 5 and FIG. 6) is erected about its upper periphery, to constitute an IC package housing portion 26 (refer to FIG. 5 and FIG. 6) which is open in an upward direction. A substantially rectangular lower mounting portion 28 is integrally formed with the housing 2, at a position corresponding to the IC package housing portion 26. The opening 22 is provided to house electronic components such as condensers (not shown) of the IC package 200, which is placed in the IC package housing portion 26, and of a circuit board 150 (refer to FIG. 5).

A great number of contact apertures 32 are formed in a matrix in the bottom surface of the IC package housing portion 26, (i.e., an IC package mounting surface 30 shown in FIG. 5), extending through the mounting portion 28. The contacts 90 are press fit and fixed within the contact apertures 32. When the contacts 90 are completely mounted within the contact apertures 32, solder balls 90b, which are to be soldered to the circuit board 150, are exposed at a lower surface 38 of the housing 2. At the same time, elastic contact pieces 90a, for contacting contacts (not shown) of the IC package 200 protrude through the IC package mounting surface 30.

Figure 4:
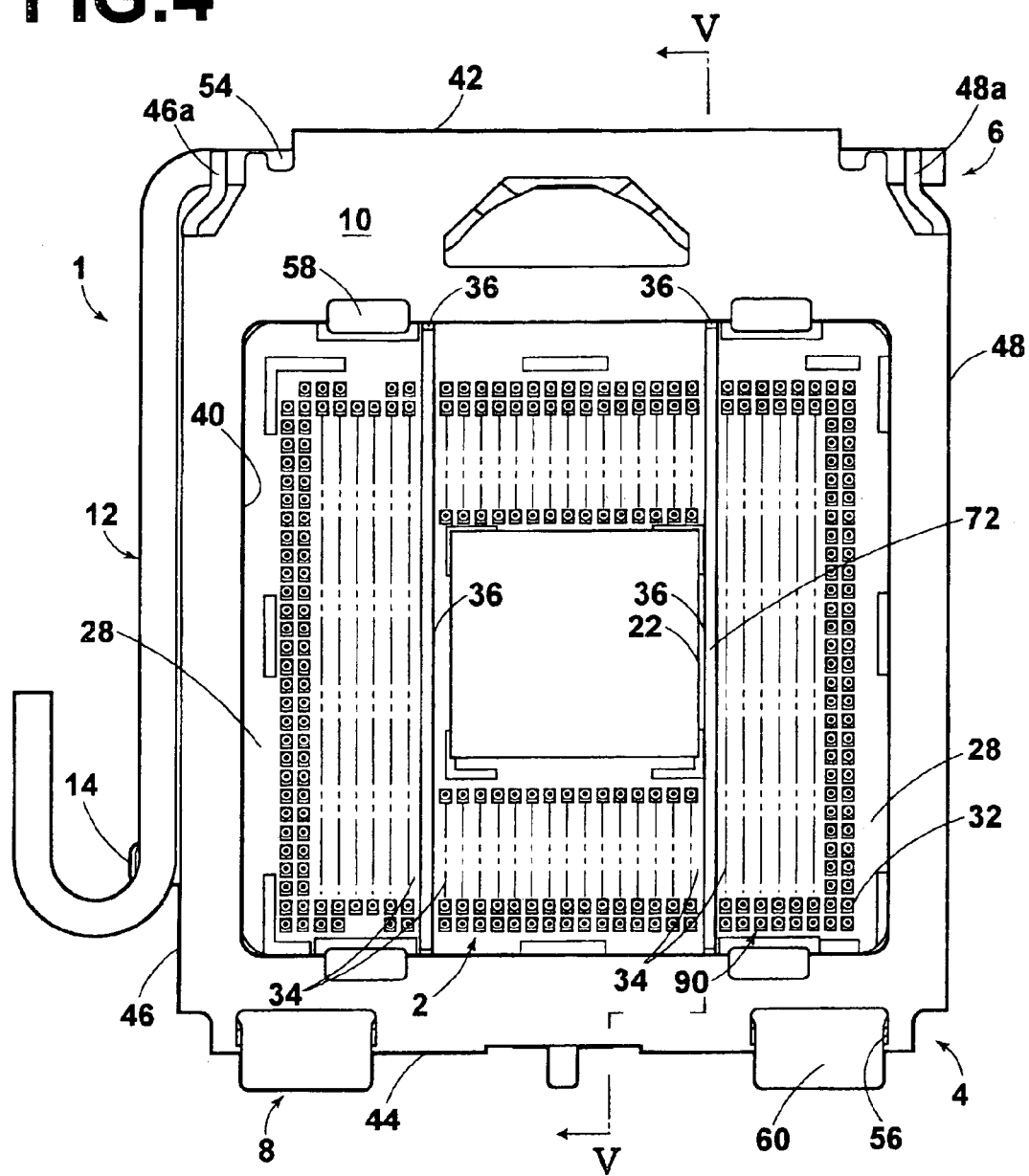
FIG. 4 is a bottom view of the IC socket assembly of FIG. 1.

As most clearly illustrated in FIG. 4, the contact apertures 32, which are arranged in a matrix, are divided into three groups by border regions 34. The border regions 34 extend linearly from the first end 4 of the assembly 1 to the second end 6, via two edges of the opening 22. Grooves 36 for mounting reinforcing beams 72, to be described later, are formed in the border regions 34 from the vicinity of a front end 2a of the housing 2 to the vicinity of the opposing rear end 2b thereof (refer to FIG. 5).

Figure 5:
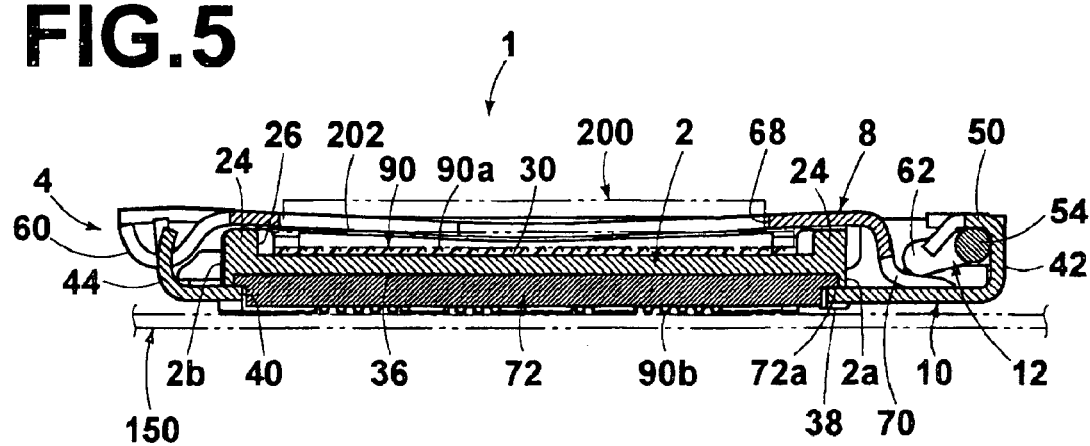
FIG. 5 is a vertical sectional view of the IC socket assembly of FIGS. 1–4, taken along line V—V of FIG. 4.
Figure 6:
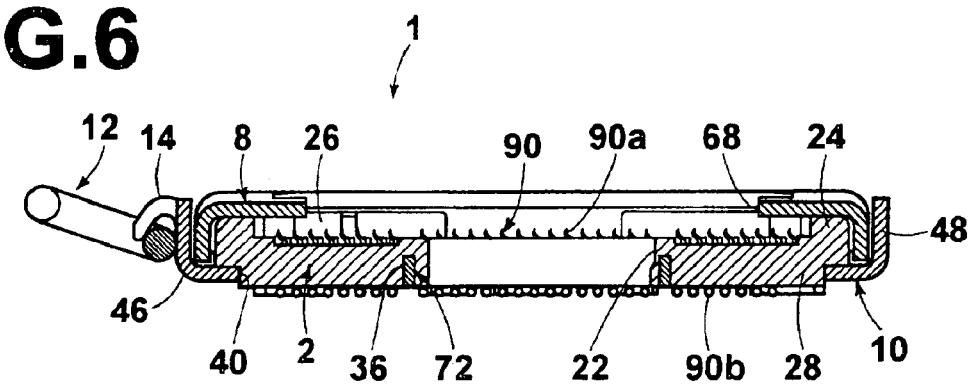
FIG. 6 is a sectional view of the IC socket assembly of FIGS. 1–5, taken along line VI—VI of FIG. 1.

The reinforcing beams 72, which are placed in the grooves 36 of the housing 2, are, in an exemplary embodiment, constituted by planar metallic members having thicknesses, that is, widths, corresponding to the depths of the grooves 36, as illustrated in FIG. 5 and FIG. 6. Downwardly facing step portions 72a, to be seated on the edges of an opening 40 of the reinforcing plate 10, are formed at both ends of the reinforcing beams 72. The reinforcing beams 72 are wide (as shown in FIG. 5), whereas the thickness of the reinforcing beams 72 in the direction perpendicular to the width is small (as shown in FIG. 6). Therefore, the border regions 34 can be made narrow. Accordingly, the area of the circuit board occupied by the reinforcing beams 72 can be minimized, as well as minimizing the effect that the provision of the reinforcing beams 72 causes on the number of contacts 90. The function of the reinforcing beams 72 will be described in detail later.

Next, the reinforcing plate 10 that supports the housing 2 from below will be described in detail. As most clearly illustrated in FIG. 4, the reinforcing plate 10 of the illustrated exemplary embodiment is formed by punching and bending a single metal plate into a substantially rectangular frame shape. The aforementioned opening 40, which is of a shape complementary to the mounting portion 28, is formed in the approximate center of the reinforcing plate 10. The mounting portion 28 is positioned within the opening 40 and protrudes downward from the reinforcing plate 10 (refer to FIG. 6).

The four sides of the reinforcing plate 10 are bent upward to form a front wall 42, a rear wall 44, and side walls 46, 48.

Holding pieces 50 and 52 are formed by bending the top of the front wall 42 inward. The holding pieces 50 and 52 are separated from each other in the lengthwise direction of the front wall 42, and serve to prevent rotating shafts 54 of the lever 12, to be described later, from being pulled out. Front ends 46a and 48a of the side walls 46 and 48 are positioned below the rotating shafts 54 of the lever 12, and cooperate with the holding pieces 50 and 52 to axially support the rotating shafts 54 in a rotatable manner.

Two rectangular openings 56 are formed in the rear wall 44 of the reinforcing plate 10, separated in the lengthwise direction of the rear wall 44. The openings 56 serve to pivotally support the cover member 8. In an exemplary embodiment, the housing 2 is fixed to the reinforcing plate 10 by heat welding four protrusions 58 (shown in FIG. 4) erected on the housing 2 to the opening 40 of the reinforcing plate 10. An engaging protrusion 14 that protrudes toward the lateral exterior, for fixing the lever 12, is formed on the side wall 46 of the reinforcing plate 10.

Next, the lever 12 for locking and releasing the cover member 8, will be described. In an exemplary embodiment, the lever 12 is formed by bending a single metallic wire, and comprises: two separate rotating shafts 54, which are supported by the holding pieces 50 and 52; a crank portion, that is, a locking portion 62, which is offset from the rotating shafts 50 and 52 and positioned therebetween; a lever arm or operating rod 64; and an operating portion 66, for rotating the rotating shafts 54. The operating rod 64 is bent perpendicular to the rotating shafts 54 in substantially the same direction that the locking portion 62 is offset therefrom. The operating portion 66 is formed by bending the operating rod 64 in a U shape.

Next, the cover member 8 will be described. Note that in the description, the portion of the cover member 8 positioned at the first end 4 of the assembly 1 will be referred to as the rear, and the portion of the cover member 8 positioned at the second end 6 will be referred to as the front. In an exemplary embodiment, the cover member 8 is formed by punching and bending a single metal plate into a substantially rectangular shape. A locking piece 70, which is to be pressed and held by the locking portion 62, is formed at the center of the front portion of the cover member 8. Support pieces 60, to be inserted into the aforementioned openings 56 thereby engaging the reinforcing plate 10, are formed at both sides of the rear portion of the cover member 8. The support pieces 60 are curved in an arcuate manner from below to above (refer to FIG. 5). The cover member 8 pivots about the engagement between the support pieces 60 and the openings 56, and is prevented from being disengaged. Note that the side of the cover member 8 at which the support pieces 60 are formed is referred to as the "axial support side", and the side of the cover member 8 at which the locking piece 70 is formed is referred to as the "engagement side".

A substantially rectangular opening 68, at which the IC package 200 is positioned, is formed in the center of the cover member 8. Note that as can be seen in FIG. 3 and FIG. 5, that the peripheral edges of the opening 68 are slightly curved downward. The reason for this curvature is to facilitate control of the load exerted on the IC package 200, when it is pressed against the assembly 1 by the cover member 8.

In addition, cutouts 69 (shown in FIG. 1) are formed toward the side of the first end 4, to eliminate interference with a flange 202 (shown in FIG. 5) of the IC package 200 when the cover member 8 is closed, thereby ensuring engagement between the locking portion 62 and the locking piece 70.

Next, a case in which the assembly 1 constructed as described above is utilized will be described. First, the lever 12 illustrated in FIG. 1 is disengaged from the engaging protrusion 14 and rotated 90 degrees in the direction toward the viewer of FIG. 1. Thereby, the engagement between the locking portion 62 and the cover member 8 is disengaged and pivoting of the cover member 8 about the axial support is enabled. Then, the IC package 200 is placed on the housing 2 as illustrated in FIG. 5, the cover member 8 is closed, and the lever 12 is rotated so that the locking portion 62 presses and fixes the locking piece 70. At this time, the upper surface of the flange 202 of the IC package 200 is pressed by the downwardly curved surface of the cover member 8.

The pressure exerted by the cover member 8 is the force that presses the IC package 200 against the contacts 90 of the housing 2. This force also acts to press the housing 2 downward and to deform the housing 2 via the contacts 90. However, the housing 2 is supported by the reinforcing beams 72, which in turn are supported by the reinforcing plate 10. Therefore, downward deformation of the housing 2 is prevented. The periphery of the housing 2 is supported by the reinforcing plate 10, therefore the housing 2 is extremely effectively supported from below by the cooperation of the reinforcing plate 10 and the reinforcing beams 72. Accordingly, the possibility of problems, such as damage to the solder connecting portions between the contacts 90 in the peripheral portions and the circuit board 150, is reduced. At the same time, separation of the contacts 90 in the central portion from the IC package 200 is also prevented.

The present invention has been described in detail above. However, the present invention is not limited to the above embodiment. Rather, various changes and modifications are possible within the scope of the present invention. For example, three or more reinforcing beams 72 may be provided instead of two.

In addition, the above embodiment describes a case in which an opening 22 is provided in the central portion of the housing 2. However, a configuration may be considered in which there is no opening 22. In this case, contacts are arranged in a matrix at the portion of the housing corresponding to the opening 22. Therefore, it is possible to provide a single reinforcing beam at the center of the mounting portion.

What is claimed is:

1. An IC socket assembly comprising:
   a plurality of electrical contacts;
   an insulative socket housing holding the electrical contacts in a matrix arrangement;
   a frame-shaped reinforcing plate supporting the lower portion of the socket housing, the frame-shaped reinforcing plate having an opening at its central portion through which the plurality of electrical contacts are exposed; and
   a cover member, pivotally supported by the reinforcing plate, sandwiching an IC package between the cover and the socket housing and to press the IC package against the electrical contacts; wherein:
   reinforcing beams for supporting the socket housing are provided across opposing edges of the opening, supported by the reinforcing plate.

2. An IC socket assembly as defined in claim 1, wherein:
   the reinforcing beams are provided across the opening from the side of an axial support portion of the cover member to an engaging portion of the cover member.

3. An IC socket assembly as defined in claim 1, wherein:
   the reinforcing beams are housed within grooves which are formed in the bottom surface of the socket housing.

4. An IC socket assembly as defined in claim 3, wherein:
   the reinforcing beams are provided across the opening from the side of an axial support portion of the cover member to an engaging portion of the cover member.

5. An IC socket assembly as defined in claim 2, wherein:
   the plurality of electrical contacts, which are arranged in a matrix, are divided into a plurality of groups by border regions; and
   the grooves are formed in the border regions.

6. An IC socket assembly as defined in claim 5, wherein:
   the reinforcing beams are provided across the opening from the side of an axial support portion of the cover member to an engaging portion of the cover member.

* * * * *